United States Patent
Gurdiel Gonzalez et al.

(10) Patent No.: US 12,365,140 B2
(45) Date of Patent: Jul. 22, 2025

(54) THREE-DIMENSIONAL PRINTING WITH DIMENSIONAL MODIFICATION COMPENSATION

(71) Applicant: Peridot Print LLC, Palo Alto, CA (US)

(72) Inventors: Enrique Gurdiel Gonzalez, Sant Cugat del Valles (ES); Victor Diego Gutierrez, Sant Cugat del Valles (ES); Manuel Freire Garcia, Sant Cugat del Valles (ES)

(73) Assignee: Peridot Print LLC, Palo Alo (CA)

( * ) Notice: Subject to any disclaimer, the term of this patent is extended or adjusted under 35 U.S.C. 154(b) by 464 days.

(21) Appl. No.: 15/734,578

(22) PCT Filed: Jan. 23, 2019

(86) PCT No.: PCT/US2019/014734
§ 371 (c)(1),
(2) Date: Dec. 3, 2020

(87) PCT Pub. No.: WO2020/153952
PCT Pub. Date: Jul. 30, 2020

(65) Prior Publication Data
US 2021/0339476 A1 Nov. 4, 2021

(51) Int. Cl.
*B29C 64/393* (2017.01)
*B29C 64/153* (2017.01)
(Continued)

(52) U.S. Cl.
CPC .......... *B29C 64/393* (2017.08); *B29C 64/153* (2017.08); *B29C 64/209* (2017.08);
(Continued)

(58) Field of Classification Search
CPC .................................................... B29C 64/393
See application file for complete search history.

(56) References Cited

U.S. PATENT DOCUMENTS

| 8,784,723 | B2 | 7/2014 | Napadensky |
| 9,827,717 | B2 | 11/2017 | Huang et al. |

(Continued)

FOREIGN PATENT DOCUMENTS

WO WO-2018194630 A1 10/2018

OTHER PUBLICATIONS

Senthilkumaran et al., New Model for Shrinkage Compensation in Selective Laser Sintering, Virtual and Physical Prototyping, Jul. 8, 2009.

(Continued)

*Primary Examiner* — Susan D Leong
*Assistant Examiner* — Tiffany Yu Huang
(74) *Attorney, Agent, or Firm* — Michael Dryja

(57) ABSTRACT

Example implementations relate to compensating for shrinkage in 3D printing. One example implementation receives an object model to print a corresponding object in a three-dimensional (3D) printer, the object model having a plurality of surface coordinates. A plurality of dimensional modification compensation factors are determined dependent on respective locations within a printing volume of the 3D printer. The object model is adjusted at the plurality of surface coordinates using respective dimensional modification compensation factors depending on the location of the surface coordinates within the printing volume in order to generate a printable object model.

12 Claims, 4 Drawing Sheets

105

110

115

(51) Int. Cl.
  *B29C 64/209* (2017.01)
  *G06F 30/20* (2020.01)
  *B33Y 10/00* (2015.01)
  *B33Y 30/00* (2015.01)
  *B33Y 50/02* (2015.01)

(52) U.S. Cl.
  CPC .............. *G06F 30/20* (2020.01); *B33Y 10/00* (2014.12); *B33Y 30/00* (2014.12); *B33Y 50/02* (2014.12)

(56) References Cited

U.S. PATENT DOCUMENTS

| | | |
|---|---|---|
| 9,886,526 B2 | 2/2018 | Huang |
| 2013/0127874 A1 | 5/2013 | Peterson |
| 2014/0107823 A1* | 4/2014 | Huang .................. B29C 64/112 700/98 |
| 2014/0184599 A1* | 7/2014 | Quilot ..................... G06T 17/20 345/423 |
| 2018/0133970 A1* | 5/2018 | Boyer ................... B33Y 40/00 |

OTHER PUBLICATIONS

Senthilkumaran et al., New Model for Shrinkage Compensation in Selective Laser Sintering, Virtual and Physical Prototyping, vol. 4, 2009—Issue 2, Nov. 29, 2018.

\* cited by examiner

THREE-DIMENSIONAL PRINTING WITH DIMENSIONAL MODIFICATION COMPENSATION

BACKGROUND

Three-dimensional objects may be produced by additive manufacturing processes which generate the object layer by layer using a three-dimensional (3D) printer. Example 3D printers may use powder bed fusion technologies in which fusion (sintering or melting) between some particles of a plastic or metal powder is performed one layer at a time. The unfused particles may be removed or reused, leaving the solid object. Temperature gradients and other printing artefacts can lead to inhomogeneous shrinkage of the fused particles which can cause shrinkage, distortion, warping and other dimensional modification of the object.

Some printing processes that generate three-dimensional (3D) objects use data generated from a model of a 3D object. This data may, for example, specify the hatch or line which the laser follows in each layer in order to fuse particles of the object. The model may be a 3D representation of the object formed by a tessellation of polygons representing the surface of the object.

BRIEF DESCRIPTION OF THE DRAWINGS

Various features of the present disclosure will be apparent from the detailed description which follows, taken in conjunction with the accompanying drawings, which together illustrate features of the present disclosure, and wherein.

DETAILED DESCRIPTION

Figure 1:
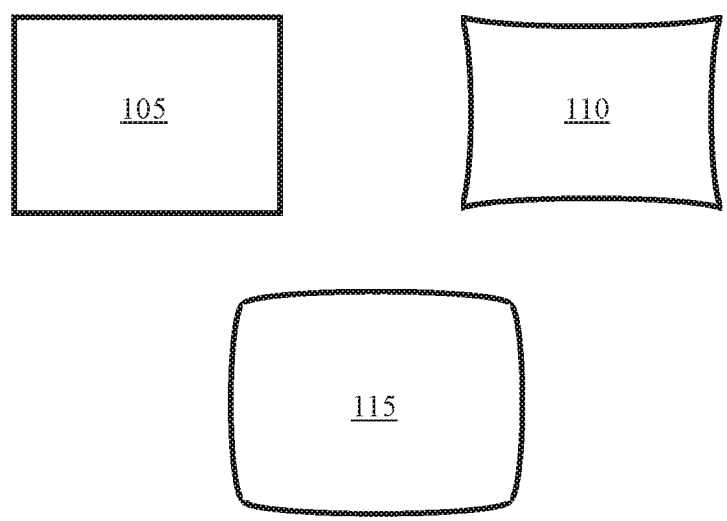
FIG. 1 illustrates compensation of an object model according to an example.

FIG. 1 illustrates dimensional modification of a 3D printed object and compensation according to an example. An object model 105 is shown with an intended geometry and can be represented by object model data such as a print file. The print file allows an object to be represented using a mesh formed from geometrical shapes, such as polygons. In an example, the print file or object model data may be a computer-aided design file such as a file in 3MF format. The print file may define a number of specifications or properties of the part to be printed, such as material, size, shape, granularity, texture and color. Each print file or object model data may contain information regarding an object to be printed by a 3D printing device, and which can be translated by a software application into printing instructions for a 3D printer.

For simplicity of explanation, in this example, a side of an object model 105 having a rectangular shape is shown. However when the object model 105 is used to print a corresponding object 110 using a 3D printer, this can result in a printed object 110 which is distorted, for example by shrinkage and/or some other dimensional modification as shown. Adjusting the object model using compensation factors according to an example generates a printable object model 115 which can be represented by printable object model data or a modified print file. As can be seen in this example, the printable object model 115 comprises convex edges which compensate for the concave edges of the printed object 110 caused by differing levels of shrinkage and/or other dimensional modification within the printed object. When the printable object model 115 is used by a 3D printer for printing, this produces a physical object more closely resembling the original object model 105. In this example, the printable object model 115 is modified compared with the object model 105 in order to compensate for the dimensional modifications expected to be incurred in the 3D printing process.

Figure 2:
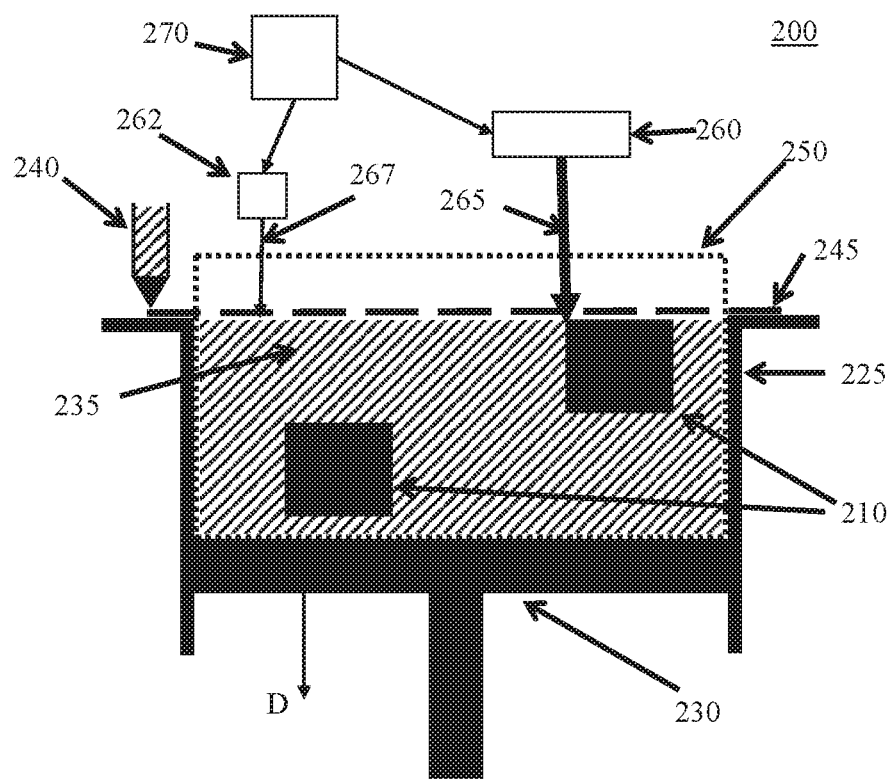
FIG. 2 illustrates an example three-dimensional printer.

FIG. 2 shows a 3D printer according to an example. The 3D printer 200 is used to print a number of objects 210, and comprises a build chamber having build chamber walls 225 and a build platform 230. The build platform 230 supports a plurality of layers of build material 235, and is movable during generation of the 3D object to accommodate each new layer of build material. The movement of the build platform 230 during layer by layer building of the 3D object is shown by arrow D. The build chamber has a build or printing volume 250 which is defined by the build chamber walls and the build platform when in its lowest position. In this example, the build volume 250 will therefore be at or below the top of the build chamber walls 225 when the last layer of build material has been added.

A layering apparatus 240 is arranged to spread a layer of build material, such as a plastic or metal powder, 235 at the top of the build chamber walls 225, along the line 245. A printhead 262 with nozzles is arranged to selectively direct or print a fusing agent or printing liquid 267 to the top or new layer of build material. A fusing agent is a material that, when a suitable amount of energy is applied to a combination of build material and fuse agent, causes the build material to melt, sinter, fuse or otherwise coalesce and solidify. Example fusing agents include carbon black and liquids containing near infrared absorbent. The fusing agent may increase heating of the build material by acting as an energy absorbing agent that can cause the build material on which it has been deposited to absorb more energy (e.g. from a radiation source) than build material on which no agent has been deposited. Preheating of the build material may be arranged to bring the temperature of the build material to close to the melting or fusing temperature of the build material. Application of the fusing agent to the build material layer may cause, during a subsequent application of energy to irradiate the build material, localized heating of the region of build material to a temperature above melting or fusing temperature. This can cause the region of build material to melt, sinter, coalesce or fuse, and then solidify after cooling. In this manner, solid parts of the object may be constructed.

In certain examples, another printhead (not shown) may be used to apply a detailing agent to the new layer of build material. The detailing agent may act to modify the effect of the fusing agent and/or directly act to cool build material. This can result in more accurate definition of the solid parts of the object.

In the example a heating apparatus 260 is arranged to apply heat energy to the layer of build material. The heating apparatus 260 may comprise a movable infrared source providing an infrared beam 265 which moves across the layer of build material causing the parts of the layer having the fusing agent to fuse and form the solid parts of the object. The remaining parts of the layer of build material are left unfused. In an alternative arrangement, a series of infrared sources may be statically located adjacent the top layer of build material and operated to cause the same fusing process. The 3D printer 200 also comprises a control module 270 which operates the print head 262. In an example the control module 270 uses printable object models to generate the 3D objects 210. The printable object models are based on object models of the 3D objects but which have been compensated for dimensional modification associated with the printing process itself. An example control module is described in more detail with respect to FIG. 7. The control module 270 may also control the build platform 230, layering apparatus 240 and heating apparatus 260. Dimensional modification of the printed objects 210 may be dependent on a number of factors including the orientation of the object as well as the location of the object within the printing volume 250. For example, objects at the center of the printing volume 250 may experience more shrinkage in all axes than objects at the edges of the printing volume.

The control module 270 of the example 3D printer 200 compensates for dimensional modification of an object dependent on the object's location within the printing volume 250. The object model is defined by different surface coordinates which are adjusted depending on their location within the printing volume, as will be described in more detail with respect to FIGS. 3 and 4.

Compensation for dimensional modification may also be used in some other types of 3D printers, including those using selective laser sintering (SLS). As in the previous example, a SLS printer may employ a moveable build platform which receives layers of build material. However instead of applying a fusing agent and heating, the solid parts of the object in each layer are created by applying a laser beam to selected parts of the layer to fuse the build material at those locations. The object models received by an example SLS printer may be adjusted differently compared with the previous example due to different dimensional modifications associated with this alternative printing technology.

Figure 3:
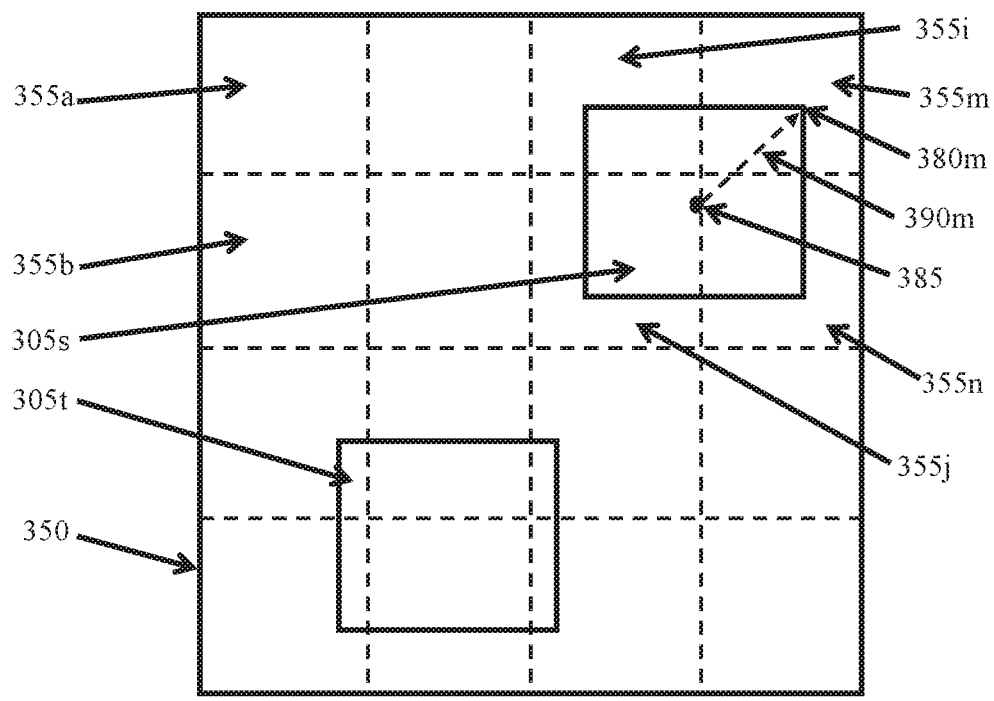
FIG. 3 illustrates an example of allocating dimensional modification compensation factors dependent on location within a printing volume.

FIG. 3 shows a printing volume 350 of a 3D printer divided into a number of sub-volumes 355. For simplicity of explanation this is shown in two dimensions, however it will be appreciated that the printing volume also extends in a third dimension. Each sub-volume is associated with respective dimensional modification compensation factors in each axis. These may be provided by the vendor of the 3D printer and determined experimentally by printing calibration objects and measuring dimensional modification at different locations within the print volume. Any surface location or coordinate of an object model 305 corresponding to an object to be printed within a particular sub-volume 355 is adjusted according to the compensation factors of that sub-volume. In the example, adjusting the surface location or coordinates of the object model may be achieved by adjusting these with respect to an origin 385. For example, the object model data 305s on the right falls within sub-volumes 355i, 355j, 355m and 355n. Surface locations of this object model data 305s falling within sub-volume 355i will be adjusted with respect to the origin 385 according to different compensation factors than those falling within sub-volume 355m. Each surface location or coordinate, for example 380m, may be represented as a vector 390m from the origin 385. The vector 390m is then adjusted by scaling in respective directions or axes according to the dimensional modification compensation factors associated with the sub-volume containing the surface location, in this case 355m.

Figure 4:
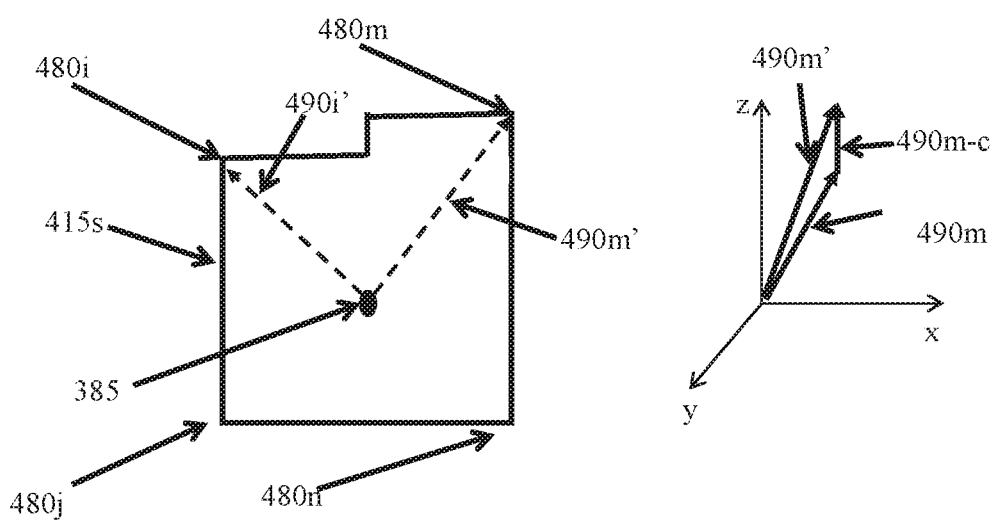
FIG. 4 illustrates adjusting an object model according to an example.

FIG. 4 illustrates a printable object model 415s in which surface coordinates of the object model 305s have been adjusted according to compensation factors associated with each of the sub-volumes 355i, 355j, 355m, 355n. For example, the corner surface coordinate 480i which falls within sub-volume 335j has an associated vector 490i' which has been adjusted differently than the vector 490m' of the corner surface coordinate 480m which falls within sub-volume 355m. To the right, the adjustment for dimensional modification for each axis x, y, z is shown for surface coordinate 480m. The surface coordinate 480m of the object model is associated with a vector 490m from the origin 385 which has been adjusted using a dimensional modification vector 490m-c to generate an adjusted surface coordinate vector 490m', which defines the location of the surface coordinate with respect to the origin 385. The dimensional adjustment vector 490m-c scales the vector 490m in each axis. In this example, the z-axis or vertical axis has the most scaling, with the x and y axes in the horizontal plane of the printing volume having relatively smaller compensation factors.

The origin may be the center of mass of the object model 305, the center of a bounding box containing the object, the center of the printing volume, or any other suitable location. The bounding box may be a cube with surfaces defined by the largest dimensions of the object in each axis.

Whilst for simplicity of explanation, this example has been described with respect to a simple cube shaped object and a small number of cube shaped sub-volumes 355, in other examples complex printable object model data may be generated for complex objects using a large number of sub-volumes having different shapes, for example tetrahedrons.

Figure 5:
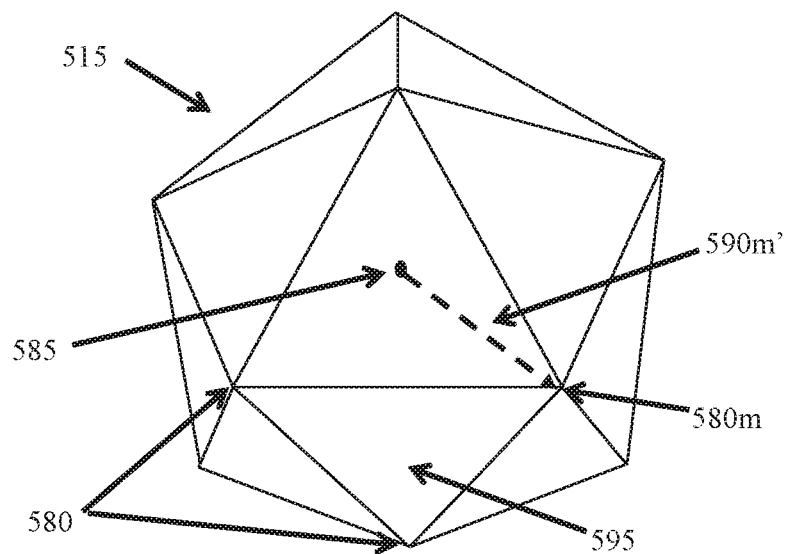
FIG. 5 illustrates an adjusted or printable object model according to another example.

FIG. 5 illustrates a printable object model according to another example. The object is a sphere which has been represented using tessellated triangles in the object model and the printable object model. Again, for the sake of simplicity of explanation a small number of triangles have been used, however a more accurate representation can be provided by using a much larger number of triangles.

This form of tessellation is used to represent objects for 3D printing in many computer aided design (CAD) packages, often using STL (stereolithography) files. STL files use polygons (triangles) to represent the surfaces of an object. Once the STL file is completed and ready for printing, it may be imported into a slicer program which converted it into printhead control data to control application or the fusing and detailing agents.

In the printable object model 515 of FIG. 5, the triangles are arranged contiguously and are each defined by a face 595 and three vertexes 580 at respective corners. The vertexes are the surface coordinates used by this example. Each vertex 580 has been scaled with respect to an origin 585 depending on the location of the vertex within a printing volume, as previously described. For example, the location of vertex 580m is described with respect to an origin 585 by vector 590m' which has been scaled in three dimension or axes according to a respective dimensional modification compensation factors in each dimension or axis associated with the location of the vertex 580 within the printing volume. The adjusted or printable object model 515 is then used to print a corresponding object.

Figure 6:
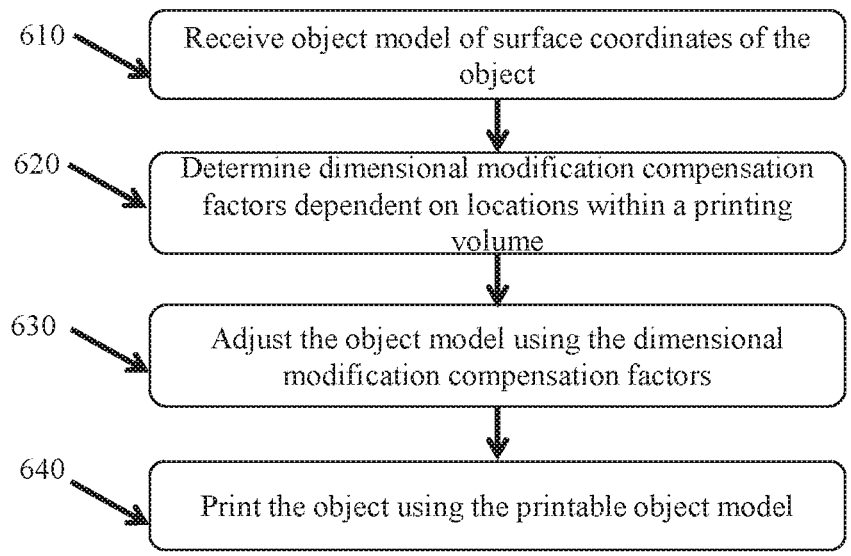
FIG. 6 is a flowchart of an example method of compensating for the dimensional modification of 3D printed objects.

A method of printing 3D objects according to an example is shown in FIG. 6. The printer initially receives an object model of surface coordinates of the object at 610. The object model may be provided in the form of object model data such as an STL file comprising a tessellation of the object. Object models for a number of objects may be received together with their locations within a printing volume of the printer.

The printer then determines dimensional modification compensation factors dependent on locations within the printing volume at 620. The dimensional modification compensation factors may be provided according to sub-volumes as previously described and may be stored within the printer. The shrinkage compensation factors may be determined experimentally by a provider of the printer, for example by printing calibration objects at different locations within the printer and measuring shrinkage and other dimensional modification using a 3D scanner. Scaling which may be the inverse of the measured dimensional modification in each axis can then be provided as an adjusting vector to be added to a vector describing the location of the surface coordinate with respect to an origin. For example, if a shrinkage of 0.3% is measured in the z-axis in a particular sub-volume, then the shrinkage compensation factor may be to increase or scale the distance from the origin to a surface coordinate in the sub-volume by 0.3% in the z-axis. Alternatively a number of calibration models may be used to fit a function dependent on location within the printer, which function can then be used to generate shrinkage compensation factors for each sub-volume.

The printer then adjusts the object model using the dimensional modification compensation factors at 630. This may be performed as previously described with respect to FIGS. 3 and 4 for example. Each surface coordinate is scaled in each axis with respect to an origin using dimensional modification compensation factors which depend on the location within the printing volume of the surface coordinate. Adjustment of the surface coordinates generates a printable object model which is used to print the object at 640. The printed object will be subject to dimensional modification, however the adjusted surface coordinates of the printable object model compensate for this and result in a printed object which is a much closer approximation to the original object model.

Printing of the object at 640 may be implemented using fusion bed powder technologies such as heating and printed fusing agents or SLS. The dimensional modification compensation factors may be dependent on the printing technology used, however the same method of printing 3D objects may be employed.

In an alternative arrangement, the compensation may be performed by a computer separate from the 3D printer, so that the printer simply receives the printable object model. The dimensional modification compensation factors may be provided to the computer as a file from the vendor of the 3D printer and may be specific to each type of 3D printer.

Figure 7:
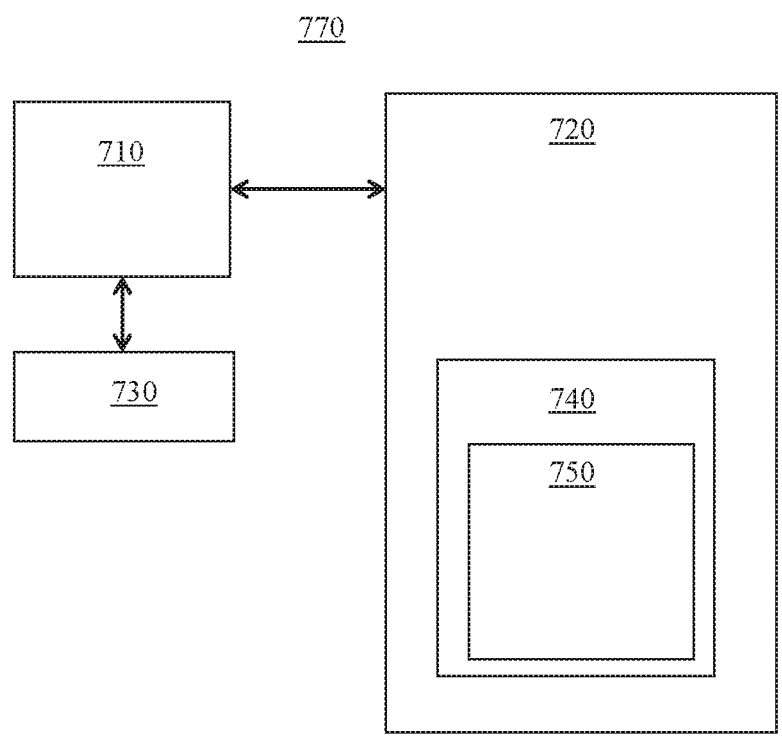
FIG. 7 illustrates an example controller of the three-dimensional printer of FIG. 1.

FIG. 7 illustrates an example controller for a 3D printer which may implement the method of FIG. 6. The controller 770 comprises a processor 710 coupled to a memory 720 which may include a non-transitory computer-readable storage medium 740 such as a USB-drive or a hard-disk drive for example. An interface 730 coupled to the processor 710 receives an object model. Computer readable instructions 750 enable the processor to determine a plurality of dimensional modification compensation factors dependent on respective locations within a printing volume of the 3D printer, and to adjust the object model at a plurality of surface coordinates using these, in order to generate a printable object model. The processor may then convert the printable object model into instructions for controlling a printhead, build platform, layering apparatus and heating apparatus such as those described with respect to FIG. 2.

The preceding description has been presented to illustrate and describe examples of the principles described. This description is not intended to be exhaustive or to limit these principles to any precise form disclosed. Many modifications and variations are possible in light of the above teaching. It is to be understood that any feature described in relation to any one example may be used alone, or in combination with other features described, and may also be used in combination with any features of any other of the examples, or any combination of any other of the examples.

What is claimed is:

1. A method comprising:
receiving an object model to print a corresponding object in a three-dimensional (3D) printer having a printing volume divided into a plurality of sub-volumes, the object model having one or multiple contiguous sub-object models, each contiguous sub-object model having a plurality of edges, each edge having a plurality of points that each have a plurality of surface coordinates;
for each point of each edge of each contiguous sub-object model, determining a plurality of dimensional modification compensation factor based on a vector from an origin of the contiguous sub-object model to the point and based on the sub-volume in which the point lies,
adjusting the object model using, for each point of each edge of each contiguous sub-object model, the determined dimensional modification compensation factor for the point in order to generate a printable object model.

2. The method of claim 1, wherein the object model comprises a tessellation of the surface of the object and each point of each edge of each contiguous sub-object model comprises a vertex of the tessellation.

3. The method of claim 1, comprising printing the object using the printable object model.

4. The method of claim 1, wherein the dimensional modification compensation factors are shrinkage compensation factors.

5. A three-dimensional (3D) printer comprising:
an interface to receive object model to print a corresponding object in the 3D printer, the object model having one or multiple contiguous sub-object models, each contiguous sub-object model having a plurality of edges, each edge having a plurality of points that each have a plurality of surface coordinates, the printer having a printing volume divided into a plurality of sub-volumes;
storage to store, for each point of each edge of each contiguous sub-object model, a dimensional modification compensation factor that is based on a vector from an origin of the contiguous sub-object model to the point and that is based on the sub-volume in which the point lies,
a processor to adjust the object model using, for each point of each edge of each contiguous sub-object model, the stored dimensional compensation modification factor for the point in order to generate a printable object model.

6. The 3D printer of claim 5, wherein the object model comprises a tessellation of the surface of the object and each point of each edge of each contiguous sub-object model comprises a vertex of the tessellation.

7. The 3D printer of claim 5, comprising a printhead arranged to apply a fusing agent to layers of build material dependent on the printable object model.

8. The 3D printer of claim 5, wherein the dimensional modification compensation factors are shrinkage compensation factors.

9. A non-transitory computer-readable storage medium storing instructions that, when executed by a processor, cause the processor to:
   receive an object model to print a corresponding object in a three-dimensional (3D) printer having a printing volume divided into a plurality of sub-volumes, the object model having one or multiple contiguous sub-object models, each contiguous sub-object model having a plurality of edges, each edge having a plurality of points that each have a plurality of surface coordinates;
   for each point of each edge of each contiguous sub-object model, determine a dimensional modification compensation factor based on a vector from an origin of the contiguous sub-object model to the point and based on the sub-volume in which the point lies,
   adjust the object model using, for each point of each edge of each contiguous sub-object model, the determined dimensional modification compensation factor for the point in order to generate a printable object model.

10. The non-transitory computer-readable storage medium of claim 9, wherein the object model comprises a tessellation of the surface of the object and each point of each edge of each contiguous sub-object model comprises a vertex of the tessellation.

11. The non-transitory computer-readable storage medium of claim 9, wherein the instructions further case the processor to print the object using the printable object model.

12. The non-transitory computer-readable storage medium of claim 9, wherein the dimensional modification compensation factors are shrinkage compensation factors.

* * * * *